United States Patent
Liu et al.

(10) Patent No.: US 10,969,682 B2
(45) Date of Patent: *Apr. 6, 2021

(54) APPARATUS AND METHOD FOR DEVELOPING A PHOTORESIST COATED SUBSTRATE

(71) Applicant: TAIWAN SEMICONDUCTOR MANUFACTURING CO., LTD., Hsinchu (TW)

(72) Inventors: Tzung-Shiun Liu, Tainan (TW); Chun-Lang Chen, Tainan County (TW); Ching-Yueh Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/913,886

(22) Filed: Jun. 26, 2020

(65) Prior Publication Data
US 2020/0326622 A1     Oct. 15, 2020

Related U.S. Application Data

(63) Continuation of application No. 16/179,724, filed on Nov. 2, 2018, now Pat. No. 10,698,313.
(Continued)

(51) Int. Cl.
*G03F 7/00* (2006.01)
*G03F 7/09* (2006.01)
(Continued)

(52) U.S. Cl.
CPC ............. *G03F 7/0025* (2013.01); *G03F 1/50* (2013.01); *G03F 7/003* (2013.01); *G03F 7/094* (2013.01); *G03F 7/30* (2013.01); *G03F 7/32* (2013.01)

(58) Field of Classification Search
None
See application file for complete search history.

(56) References Cited

U.S. PATENT DOCUMENTS

| 4,429,983 A | 2/1984 | Cortellino et al. |
| 4,466,864 A | 8/1984 | Bacon et al. |
| (Continued) | | |

OTHER PUBLICATIONS

Non-Final Office Action issued in U.S. Appl. No. 16/179,724, dated Sep. 20, 2019.
(Continued)

*Primary Examiner* — Rodney E Fuller
(74) *Attorney, Agent, or Firm* — McDermott Will & Emery LLP

(57) ABSTRACT

An apparatus includes a developing tank, and the developing tank has a sidewall and a bottom. A fluid manifold is adjacent the bottom of the developing tank. The fluid manifold includes a plurality of holes and a plurality of valves. Developer and rinsing fluid flow through the plurality of holes. Each of the plurality of the valves corresponds to a different hole of the plurality of holes, and the plurality of valves allow the developer and the rinsing fluid to flow through the holes when open and prevent the developer and the flowing liquid from flowing through the holes when closed. The developer flows through a developer inlet to the fluid manifold. The rinsing fluid flows through a rinsing fluid inlet to the fluid manifold. A controller is configured to individually control opening and closing of each of the plurality of valves.

20 Claims, 16 Drawing Sheets

Related U.S. Application Data

(60) Provisional application No. 62/590,099, filed on Nov. 22, 2017.

(51) Int. Cl.
  *G03F 7/32* (2006.01)
  *G03F 1/50* (2012.01)
  *G03F 7/30* (2006.01)

(56) References Cited

U.S. PATENT DOCUMENTS

| | | |
|---|---|---|
| 4,922,277 A | 5/1990 | Carlson et al. |
| 5,168,886 A | 12/1992 | Thompson et al. |
| 5,224,504 A | 7/1993 | Thompson et al. |
| 5,235,995 A | 8/1993 | Bergman et al. |
| 6,015,462 A | 1/2000 | Doolittle |
| 7,033,089 B2 | 4/2006 | Takasu et al. |
| 7,138,016 B2 | 11/2006 | Reardon et al. |
| 7,585,398 B2 | 9/2009 | Hanson et al. |
| 10,698,313 B2 * | 6/2020 | Liu .................... G03F 7/094 |
| 2002/0189756 A1 | 12/2002 | Boehme et al. |

OTHER PUBLICATIONS

Notice of Allowance issued in U.S. Appl. No. 16/179,724, dated Feb. 20, 2020.

\* cited by examiner

APPARATUS AND METHOD FOR DEVELOPING A PHOTORESIST COATED SUBSTRATE

CROSS-REFERENCE TO RELATED APPLICATIONS

This application is a Continuation of U.S. application Ser. No. 16/179,724 filed Nov. 2, 2018, now U.S. Pat. No. 10,698,313, which claims priority to U.S. Provisional Application No. 62/590,099 filed Nov. 22, 2017, the subject matter of each of which is incorporated herein by reference in their entireties.

TECHNICAL FIELD

The disclosure relates to an apparatus and method for manufacturing a photomask. In particular the disclosure relates to an apparatus for developing a pattern formed on a photomask and a method of developing a photoresist pattern formed on the photomask.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size. The decrease in size of devices has been met with advancements in semiconductor manufacturing techniques such as lithography.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 6A is a plan view of the developing platform and FIG. 6B is an isometric view of the developing platform.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
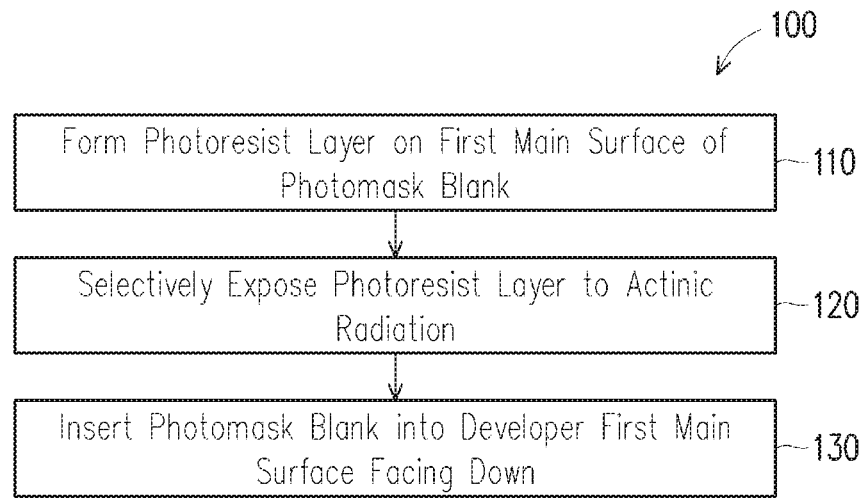
FIG. 1 illustrates a process flow of manufacturing a photomask according to embodiments of the disclosure.
Figure 3:
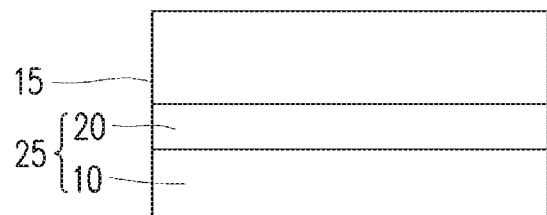
FIG. 3 shows a process stage of a sequential operation according to an embodiment of the disclosure.
Figure 4:
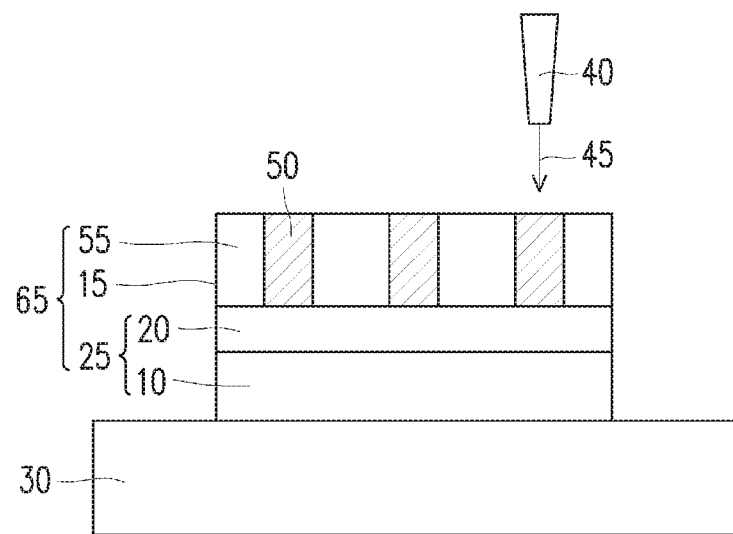
FIG. 4 shows a process stage of a sequential operation according to an embodiment of the disclosure.
Figure 5A:
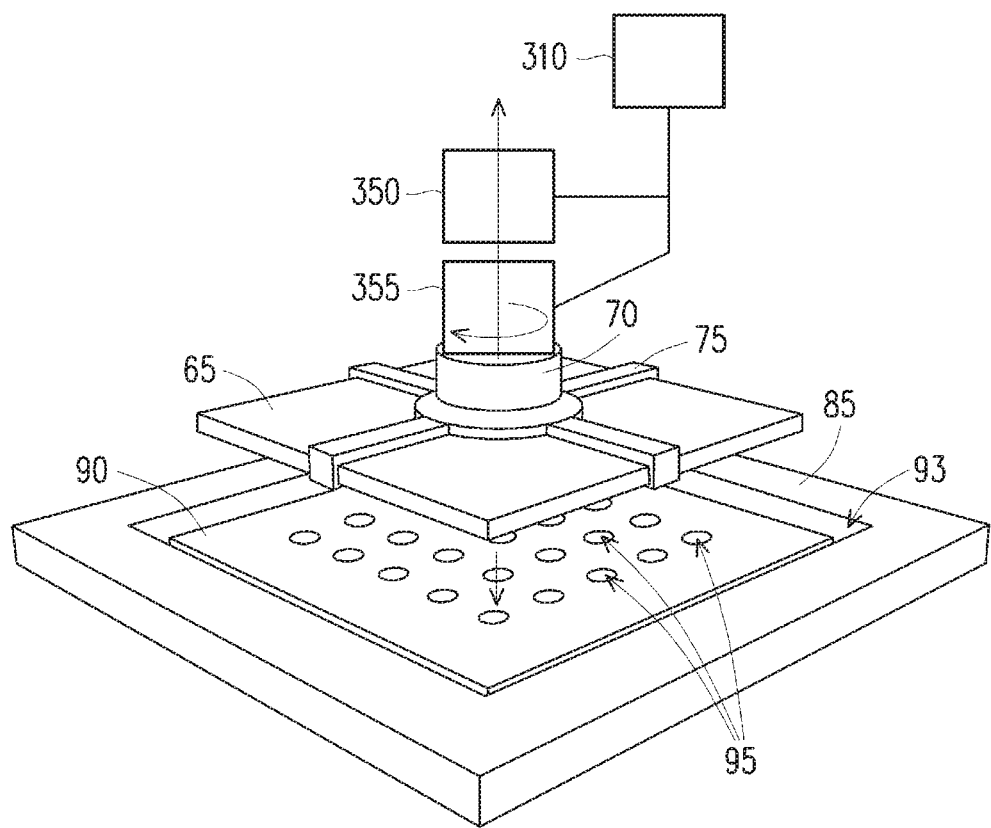
FIGS. 5A, 5B, and 5C show process stages of sequential operations according to an embodiment of the disclosure.
Figure 5B:
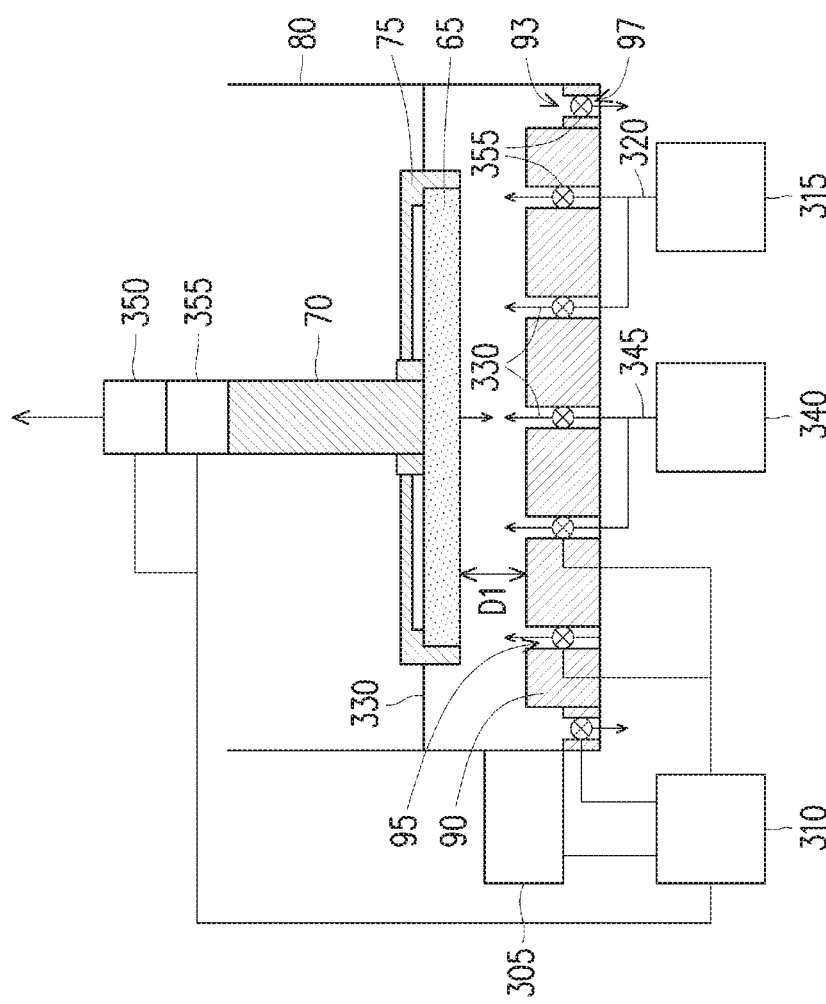

FIG. 1 illustrates a process flow 100 of manufacturing a photomask according to embodiments of the disclosure. As shown in FIG. 3, a photoresist layer 15 is formed on a first main surface of a photomask blank 25 in operation 110. The photomask blank 25 includes a radiation blocking layer 20 disposed on a main surface of a transparent substrate 10. The photoresist layer 15 is selectively exposed to actinic radiation 45 in operation 120, as shown in FIG. 4. The photomask blank 25 with the selectively exposed photoresist layer 65 is inserted into a developing tank 80 containing developer so that the first main surface of the photomask blank 25 faces a bottom surface 90 of the developing tank 80 in operation 130, as shown in FIGS. 5A and 5B.

Figure 2:
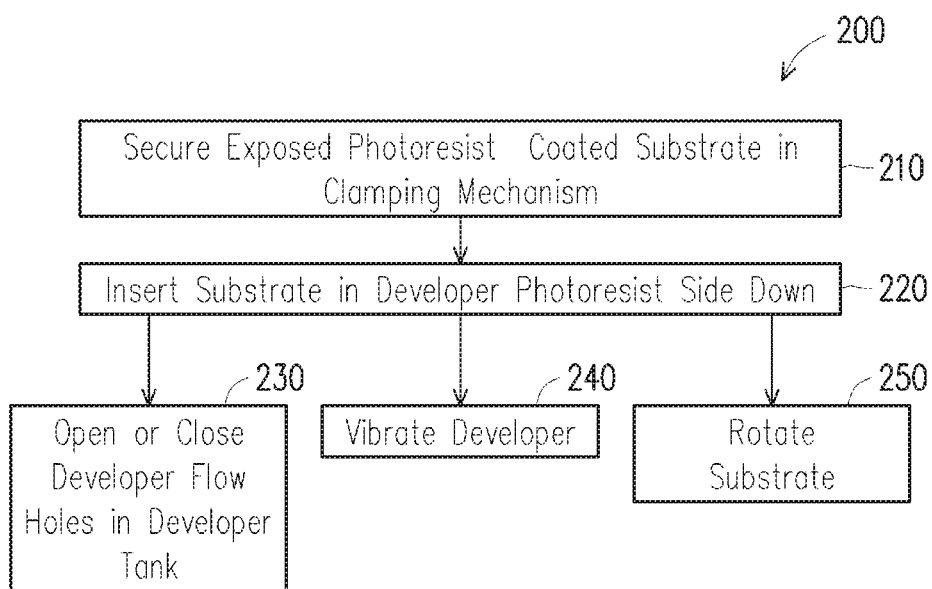
FIG. 2 illustrates a process flow of developing a photoresist pattern on a substrate according to embodiments of the disclosure.

FIG. 2 illustrates a process flow 200 of developing a photoresist pattern on a substrate according to embodiments of the disclosure. A selectively exposed photoresist coated substrate 65 is secured in a clamping mechanism 70 in operation 210. The photoresist coated substrate 65 is inserted into the developer 330 with the photoresist coated side of the substrate facing down in operation 220, as shown in FIGS. 5A and 5B. In some embodiments, one or more holes 95 in the bottom 90 of the developing tank 80 are open or closed to permit or prevent the passage of developer 330 in operation 230. In some embodiments, the through holes 95 are opened and closed during the developing operation. In some embodiments, the developer 330 is vibrated during development in operation 240. In some embodiments, the substrate 65 is rotated during development in operation 250.

In some embodiments, the area of the bottom 90 of the developing tank including the through holes 95 is greater than the area of the substrate 65 being developed. Thus, the entire surface of the substrate 65 being developed is directly exposed to the developer flowing through the through holes 95, in some embodiments. For example, if the substrate is rectangular-shaped with a diagonal length X, the bottom 90 of the developing tank including the through holes 95 would each have a length and width of at least X. For example, if the substrate has diagonal length of about 20 cm, the bottom 90 of the developing tank including the through holes 95 would each have a length and width of at least about 20 cm.

The disclosed methods for manufacturing a photomask and developing a photoresist pattern, along with apparatuses for developing a photoresist layer will be discussed in further detail herein.

As shown in FIG. 3, a photomask blank 25 is provided. The photomask blank 25 includes a light blocking layer 20 formed over a substrate 10. The substrate 10 is transparent to ultraviolet radiation. In some embodiments, the substrate 10 is made of quartz, soda lime glass, or $CaF_2$. The light blocking layer 20 is formed of a material that absorbs or reflects ultraviolet radiation. The light blocking layer 15 does not allow ultraviolet radiation to pass through, thereby confining the ultraviolet radiation that passes through the completed photomask to the regions where the light blocking material is removed. In some embodiments, the light blocking material includes chromium. In some embodiments, the light blocking layer 15 is formed by a suitable deposition technique, including chemical vapor deposition (CVD), atomic layer deposition (ALD), and physical vapor deposition (sputtering). In some embodiments, the thickness of the light blocking layer 15 ranges from about 20 nm to about 100 nm.

The photoresist layer 15 is a photosensitive layer that is patterned by exposure to actinic radiation, such as an electron beam (e-beam) in some embodiments. Typically, the chemical properties of the photoresist regions struck by incident radiation change in a manner that depends on the type of photoresist used. Photoresist layers 15 are typically positive resists or negative resists. Conventionally, positive resist refers to a photoresist material that when exposed to radiation becomes soluble in a developer, while the region of the photoresist that is non-exposed (or exposed less) is insoluble in the developer. Negative resist, on the other hand, conventionally refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive or negative resist may depend on the type of developer used to develop the resist. For example, some positive photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative photoresists developed with the TMAH solution, the unexposed regions of the photoresist are removed by the TMAH, and the exposed regions of the photoresist, that undergo cross-linking upon exposure to actinic radiation, remain on the substrate after development.

Photoresists according to the present disclosure include a polymer resin along with one or more photoactive compounds (PACs) in a solvent, in some embodiments. In some embodiments, the polymer resin includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Additionally, some embodiments of the photoresist include one or more photoactive compounds (PACs). The PACs are photoactive components, such as photoacid generators, photobase generators, free-radical generators, or the like. The PACs may be positive-acting or negative-acting.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

The individual components of the photoresist are placed into a solvent in order to aid in the mixing and dispensing of the photoresist. To aid in the mixing and dispensing of the photoresist, the solvent is chosen at least in part based upon the materials chosen for the polymer resins as well as the PACs. In some embodiments, the solvent is chosen such that the polymer resins (photoresist polymer and protective polymer) and the PACs can be evenly dissolved into the solvent and dispensed upon the layer to be patterned.

In addition to the polymer resins, the PACs, and the solvents, the cross-linking agent, and the coupling reagent, some embodiments of the photoresist also includes a number of other additives that assist the photoresist in obtaining high resolution in some embodiments. For example, some embodiments of the photoresist also include surfactants in order to help improve the ability of the photoresist to coat the surface on which it is applied.

Another additive added to some embodiments of the photoresist is a quencher, which inhibits diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. In some embodiments, an organic acid is used as the quencher.

Other additives added to some embodiments of the photoresist include a stabilizer, which assists in preventing undesired diffusion of the acids generated during exposure of the photoresist; a dissolution inhibitor to help control dissolution of the photoresist during development; a plasticizer to reduce delamination and cracking between the photoresist and underlying layers; a coloring agent to assist observers in examining the photoresist to find any defects that may need to be remedied prior to further processing; adhesion additives to promote adhesion between the photoresist and an underlying layer upon which the photoresist has been applied (e.g., the layer to be patterned); and surface leveling agents to assist a top surface of the photoresist to be level, so that impinging light will not be adversely modified by an unlevel surface.

In some embodiments, the polymer resin and the PACs, along with any desired additives or other agents, are added to the solvent for application. Once added, the mixture is then mixed in order to achieve a homogenous composition throughout the photoresist to ensure that there are no defects caused by uneven mixing or nonhomogenous composition of the photoresist. Once mixed together, the photoresist may either be stored prior to its usage or used immediately.

Once ready, the photoresist composition is applied onto the substrate to be patterned 20 to form a photoresist layer 15. In some embodiments, the photoresist layer 15 thickness ranges from about 10 nm to about 300 nm.

After the photoresist layer 15 has been applied to the layer to be patterned 20, a pre-bake of the photoresist layer is performed in some embodiments to cure and dry the photoresist prior to radiation exposure. In some embodiments, the pre-baking is performed at a temperature suitable to evaporate the solvent, such as between about 50° C. and 250° C., although the precise temperature depends upon the materials chosen for the photoresist.

FIG. 4 illustrates a selective exposure of the photoresist layer 15 to form an exposed region 50 and an unexposed region 55. In some embodiments, the exposure to radiation is carried out by placing the photoresist coated substrate in a photolithography tool, such as an electron beam (e-beam) maskwriter. To selectively expose the photoresist coated substrate or photomask blank 65, a source of radiation 40 for the exposure directs the exposure radiation 45 to the photoresist layer 15. The photoresist coated substrate or photomask blank 65 is secured to a movable stage 30 for supporting and moving the substrate 65 under the exposure radiation.

In some embodiments, the radiation source 40 supplies radiation 45, such as an electron beam, to the photoresist layer 15 in order to induce a reaction of the PACs, which in turn reacts with the polymer resin to chemically alter those regions of the photoresist layer to which the radiation 45 impinges. In some embodiments, the radiation 45 is far ultraviolet radiation, extreme ultraviolet radiation, x-rays, electron beam, ion beam, or the like.

After the photoresist layer 15 has been exposed to the exposure radiation 45, a post-exposure baking is performed at a temperature ranging from about 50° C. to about 160° C. in some embodiments to assist in the generating, dispersing, and reacting of the acid/base/free radical generated from the impingement of the radiation 45 upon the PACs during the exposure.

After the selective radiation exposure and/or the post-exposure bake operation, the PAC in the photoresist produces an acid in some embodiments, and thus increases or decreases its solubility. The solubility may be increased for positive resist (i.e., the acid will cleave an acid cleavable polymer, resulting in the polymer becoming more hydrophilic) and decreased for negative resist (i.e., the acid will catalyze an acid catalyzed crosslinkable polymer or cause a polymeric pinnacle to undergo pinacol rearrangement, resulting in the polymer becoming more hydrophobic). Thus, when an aqueous-based developer is used, the developer will dissolve the exposed portions of the positive resist but not the exposed portions of the negative resist.

In some embodiments, a cross-linking reaction occurs as a result of the exposure to actinic radiation. The cross-linking reaction increases the molecular weight of the polymers. By increasing the molecular weight of the polymers through the cross-linking reaction, the new cross-linked polymer becomes less soluble in organic solvent negative resist developers.

After selective exposure to radiation and any post-exposure baking, the exposed photoresist layer 15 is developed to form a photoresist pattern. Development is performed using a solvent. In some embodiments where positive tone development is desired, a positive tone developer such as a basic aqueous solution is used to remove regions 50 of the photoresist layer exposed to radiation. In some embodiments, the positive tone developer includes one or more selected from tetramethylammonium hydroxide (TMAH), tetrabutylammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

In some embodiments where negative tone development is desired, an organic solvent or critical fluid is used to remove the unexposed regions 55 of the photoresist layer. In some embodiments, the negative tone developer includes one or more selected from hexane, heptane, octane, toluene, xylene, dichloromethane, chloroform, carbon tetrachloride, trichloroethylene, and like hydrocarbon solvents; critical carbon dioxide, methanol, ethanol, propanol, butanol, and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; pyridine, formamide, and N,N-dimethyl formamide or the like.

Figure 5C:
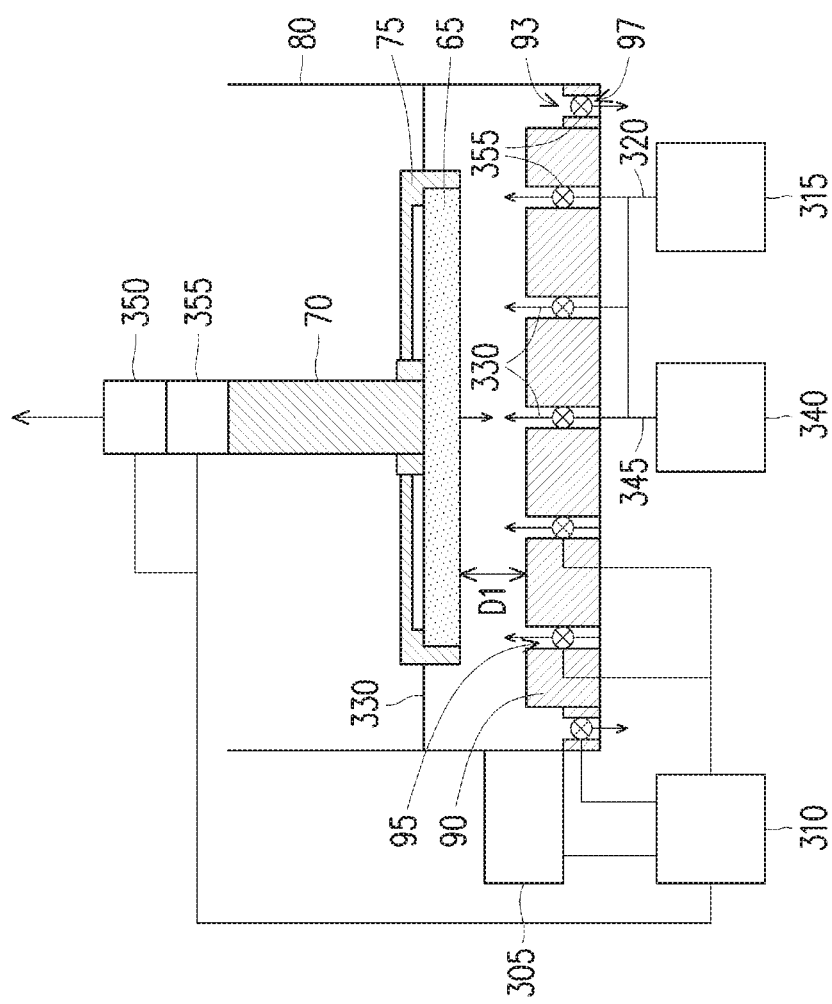

As shown in FIGS. 5A, 5B, and 5C, the exposed photoresist coated substrate or photomask blank 65 is secured to a clamping mechanism 70 in some embodiments and introduced into a developing tank 80. FIG. 5A is an isometric view showing an apparatus for developing the photoresist layer including a clamping mechanism 70 and a developing platform 85. The exposed photoresist coated substrate or photomask blank 65 is attached to the clamping mechanism to be lowered into the developing tank 80. FIGS. 5B and 5C are simplified cross-sectional views showing the photoresist coated substrate or photomask blank 65 immersed in developer 330 in the developing tank 80.

The clamping mechanism 70 includes clamping arms 75 that attach to side walls of the photoresist coated substrate or photomask blank 65. The photoresist coated substrate or photomask blank 65 is inserted into the clamping mechanism 70 so that the photoresist coated main surface of the substrate or photomask blank 65 faces the developing platform 85 or the bottom of the developing tank 80. In some embodiments, the distance D1 between the photoresist coated substrate or photomask blank 65 and an upper surface of the developing platform 85 is about 2 mm to about 10 mm. If the distance D1 is less than about 2 mm, there is a risk of scratching the surface of the substrate or photomask blank 65. If the distance D1 is too large, e.g.—greater than about 10 mm, the efficiency of the development operation is significantly reduced. In some embodiments, the clamping arms 75 do not cover the front surface of the photoresist layer 15. Thus, the clamping arms 75 do not interfere with the developing operation. In some embodiments, the clamping mechanism 70 is moved by a motor 350 in the vertical direction to lower the photoresist coated substrate or photomask blank 65 into the developing tank 80 and raise it out of the tank 80. The clamping mechanism 70 includes a rotation mechanism 355 that also rotates the photoresist coated substrate or photomask blank 65 in the developing tank 80 during the developing operation in some embodiments.

In some embodiments, the developing platform 85 is located in the bottom the developing tank 80. In some embodiments, the developing platform 85 includes a developer manifold 90 including one or more holes 95 for introducing developer 330 from a developer storage container 315 into the developing tank 80, and a trench 93 with drain holes 97 for draining developer 330 from the developing tank 80. In some embodiments, valves 335 open and close to allow developer 330 to flow into or drain from the developing tank 80. In some embodiments, the valves 335 are electromagnetic valves.

In some embodiments, the developer 330 is supplied from the developer storage container 315 through the holes 95 via developer inlets 320 at a rate of between about 5 ml/min and about 800 ml/min, while the photoresist coated substrate or photomask blank 65 is rotated at a speed of between about 50 rpm and about 2000 rpm. In some embodiments, the developer 330 is at a temperature of between about 10° C. and about 80° C. Development is more efficient at higher developer flowrates, temperatures, and rotation speeds, however, at too high flowrates, temperatures, and rotation speeds the photoresist or photomask blank can be damaged. At flowrates, temperatures, or rotation speeds below the ranges disclosed herein, development may proceed very slowly. The development operation continues for between about 30 seconds to about 10 minutes in some embodiments.

In some embodiments, the developer 330 is vibrated during development. The developing tank 80 shown in FIG. 5B, further includes an electro-actuatable element 305 producing a disturbance in the developer fluid 330. In some embodiments, the electro-actuatable element 305 is a piezoelectric actuator that applies vibration to the developer fluid 330. In some embodiments, the electro-actuatable element 305 is an ultrasonic transducer or a megasonic transducer. In some embodiments, megasonic waves are applied to the developer 330 during development.

In some embodiments, the developing apparatus includes a controller 310. The controller 310 is configured to control at least one of, or all of, the clamping mechanism 70, the electro-actuatable element 305, and the fluid valves 335. As shown in FIGS. 5B and 5C, in some embodiments, the controller 310 individually controls each of the fluid valves 335. To simplify the drawings, FIGS. 5B and 5C show the controller controlling two fluid valves 335, however, it is understood that each valve 335 can be individually controlled by the controller 310. The controller 310 controls the motor 350 for raising and lowering the clamping mechanism 70 and the rotation mechanism 355 for rotating the clamping mechanism 70 in some embodiments. In some embodiments, the controller 310 controls opening and closing of the fluid valves 335 to allow fluid flow or drain the developing tank 80. In some embodiments, the controller 310 turns the electro-actuatable element 305 on or off and adjusts the vibration frequency of the electro-actuatable element 305.

After the photoresist pattern is developed, the photoresist coated substrate or photomask blank 65 is rinsed with a rinsing fluid. The rinsing fluid is stored in a rinsing fluid storage container 340. In some embodiments, the rinsing fluid is provided to the through holes 95 through a rinsing inlet 345.

In some embodiments, the developer 330 is provided to certain holes 95 and the rinsing fluid is provided to other holes 95, as shown in FIG. 5B. In other embodiments, the rinsing fluid is provided to the same holes 95 as the developer fluid as shown in FIG. 5C. As shown in FIG. 5C, in some embodiments, the developer inlets 320 and the rinsing fluid inlets 345 are connected.

Figure 6A:
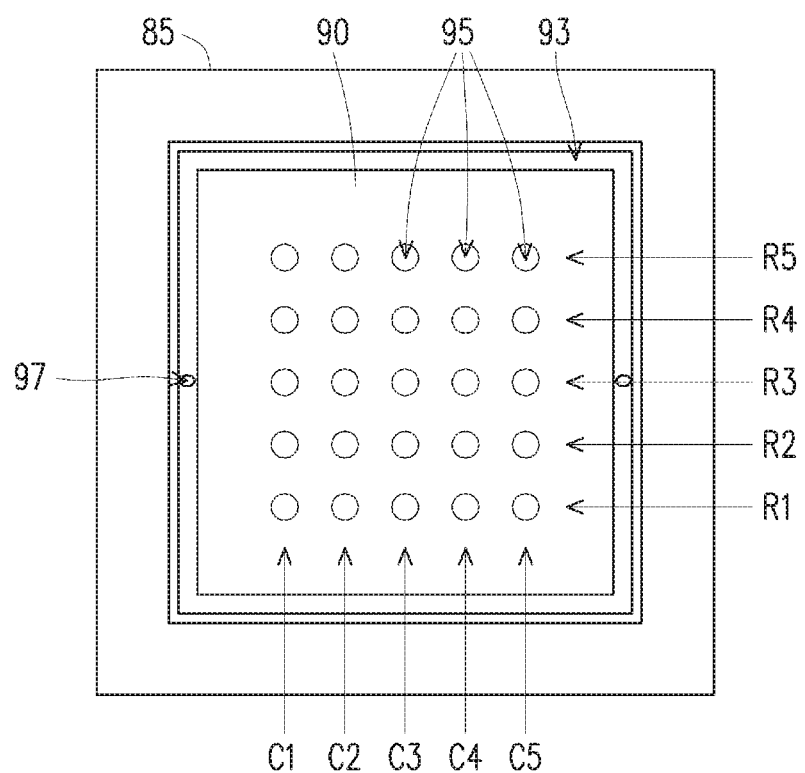
FIGS. 6A and 6B illustrate a developing platform according to an embodiment of the disclosure.
Figure 6B:
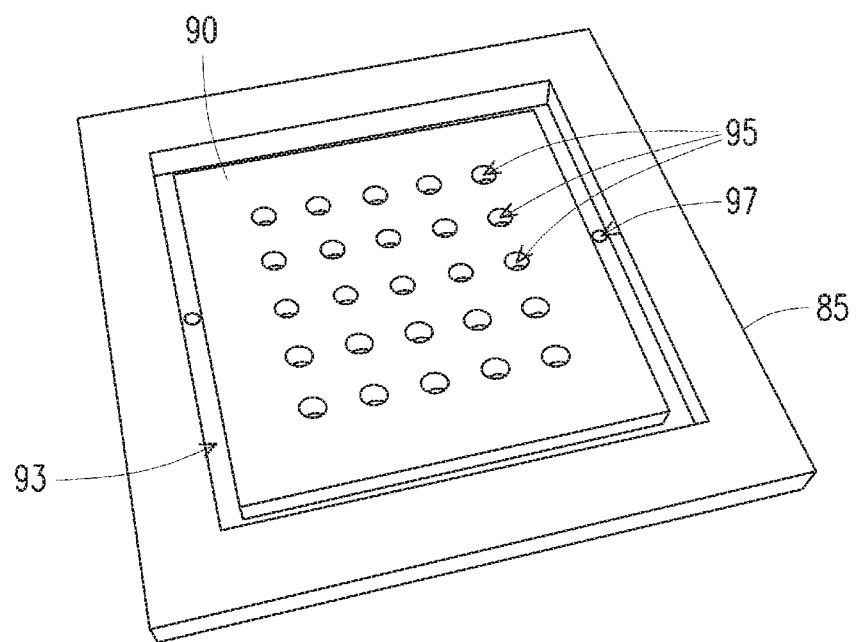

FIGS. 6A and 6B illustrate a developing platform according to an embodiment of the disclosure. FIG. 6A is a plan view of the developing platform and FIG. 6B is an isometric view of the developing platform. The developing platform 85 includes a developer manifold 90 having a plurality of holes 95 through which the developer 330 flows during development. The plurality of holes 95 are arranged in a column (C) and row (R) arrangement in some embodiments. Although, a column and row arrangement of the holes 95 is shown, the present disclosure is not limited to a column/hole arrangement. Other hole arrangements are used in other embodiments, including circular and spiral patterns. The holes 95 can be opened or closed to allow or block developer 330 flow in some embodiments. In the embodiment illustrated in FIGS. 6A and 6B all the holes 95 are opened, allowing developer to flow and develop the latent pattern in the exposed photoresist layer 15. The developer drains from the developing tank 80 through drain holes 97 in the trench 93 surrounding the developer manifold 90.

FIGS. 7A, 7B, 7C, and 7D are plan views illustrating developing platforms according to embodiments of the disclosure. In FIGS. 7A, 7B, 7C, 7D, different arrangements of holes and disclosing platform manifold holes 95 are illustrated. The arrangement of open and closed holes 95 can be varied to optimize the development operation. Testing can be performed to determine the optimum hole arrangement for developing specific patterns. The opening and closing of the holes 95 is controlled by the controller 310 in some embodiments. The holes 95 are opened or closed by opening or closing a gate, diaphragm, or valve 335 at each hole 95 in some embodiments. The developer 330 is stored in a developer storage container 315 and supplied to the developing platform 85 through a developer inlet 320 in some embodiments. Rinsing fluid is stored in a rinsing fluid storage container 340 and supplied to the developing platform through an inlet 345 in some embodiments. Pumps (not shown) are used in some embodiments to deliver developer and fluid to the developing tank and to drain developer and rinsing fluid from the developing tank 80 in some embodiments.

Figure 7A:
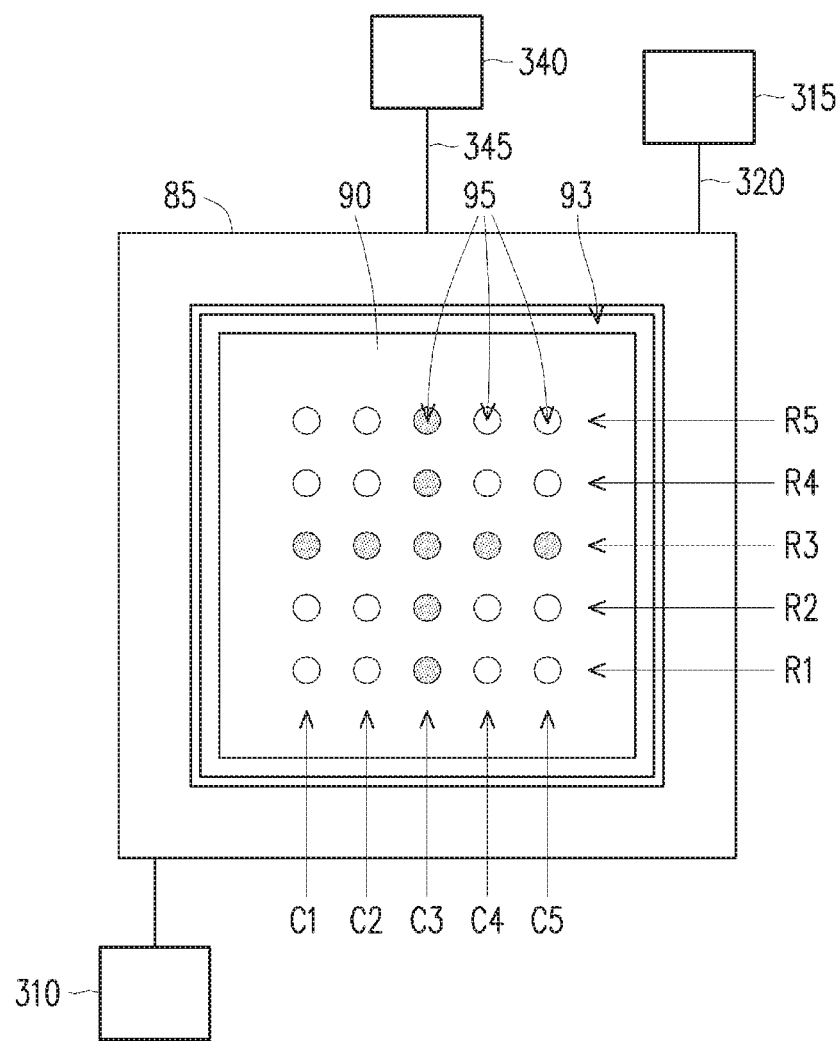
FIGS. 7A, 7B, 7C, and 7D are plan views illustrating developing platforms according to embodiments of the disclosure.

FIG. 7A illustrates an embodiment where holes R1, C1; R1, C2; R1, C4; R1, C5; R2, C1; R2, C2; R2, C4; R2, C5; R4, C1; R4, C2; R4, C4; R4, C5; R5, C1; R5, C2; R5, C4; and R5, C5 are open; and holes R1, C3; R2, C3; R3, C1; R3, C2; R3, C3; R3, C4; R3, C5; R4, C3; and R5, C3 are closed.

Figure 7B:
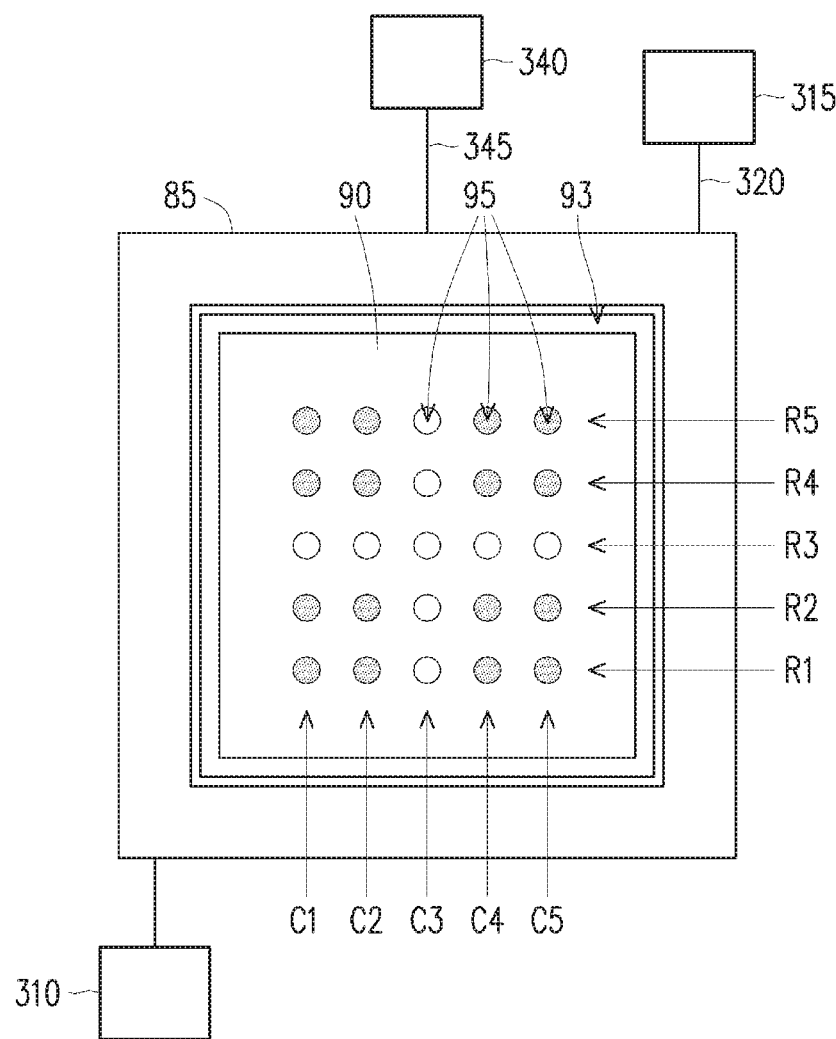

FIG. 7B illustrate an embodiment, which is the inverse of the embodiment of FIG. 7A, where holes R1, C1; R1, C2; R1, C4; R1, C5; R2, C1; R2, C2; R2, C4; R2, C5; R4, C1; R4, C2; R4, C4; R4, C5; R5, C1; R5, C2; R5, C4; and R5, C5 are closed; and holes R1, C3; R2, C3; R3, C1; R3, C2; R3, C3; R3, C4; R3, C5; R4, C3; and R5, C3 are open.

Figure 7C:
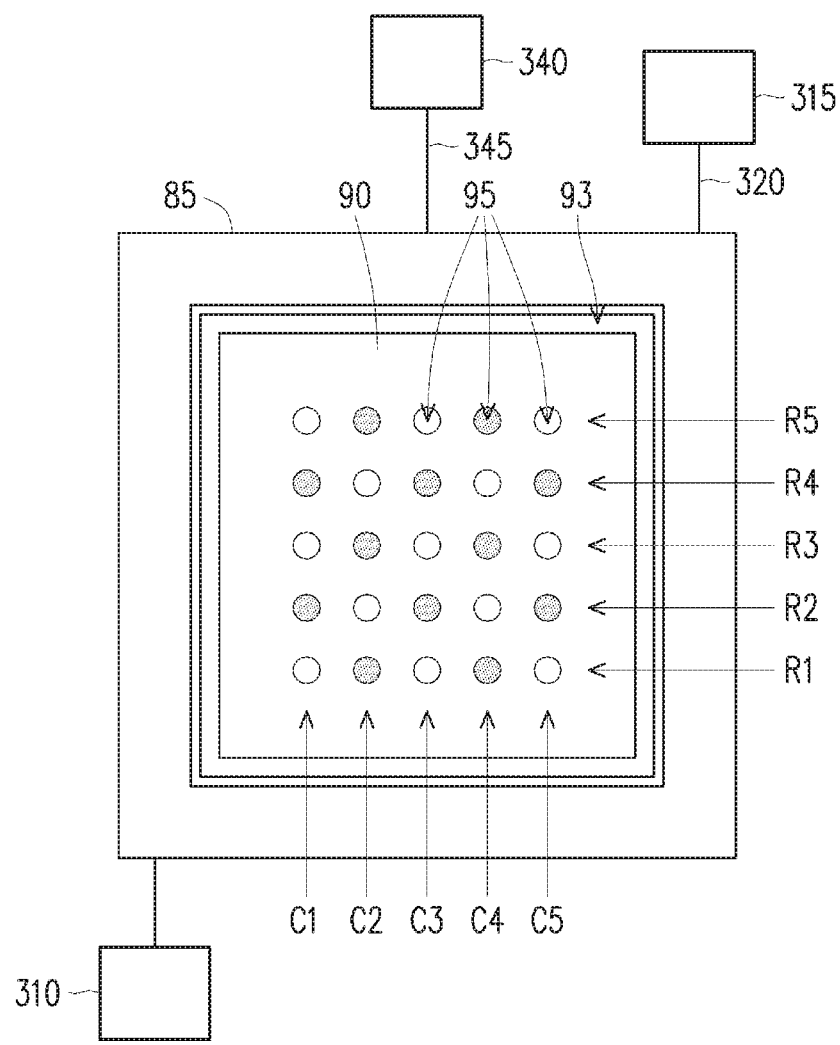

In the embodiment of FIG. 7C, holes R1, C1; R1, C3; R1, C5; R2, C2; R2, C4; R3, C1; R3, C3; R3, C5; R4, C2; R4, C4; R5, C1; R5, C3; and R5, C5 are open; and holes R1, C2; R1, C4; R2, C1; R2, C3; R2, C5; R3, C2; R3, C4; R4, C1; R4, C3; R4, C5; R5, C2; and R5, C4 are closed.

Figure 7D:
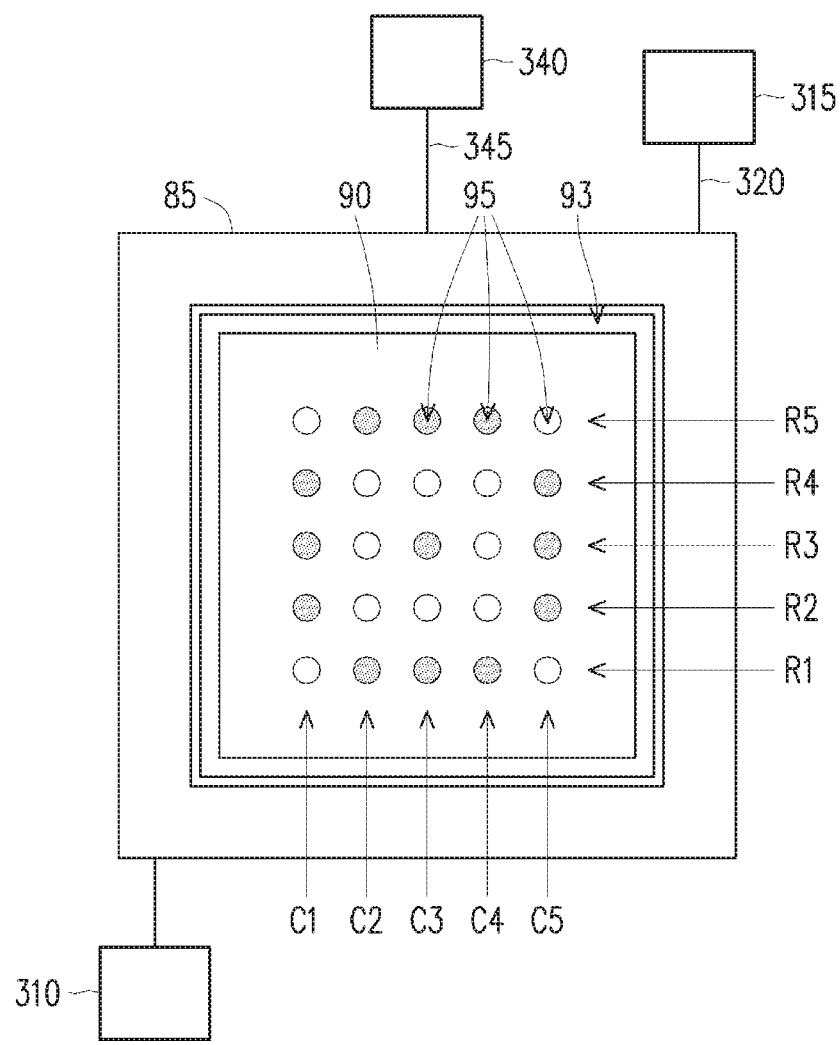

In another embodiment, as shown in FIG. 7D, holes R1, C1; R1, C5; R2, C2; R2, C3; R2, C4; R3, C2; R3, C4; R4, C2; R4, C3; R4, C4; R5, C1; and R5, C5 are open; and holes R1, C2; R1, C3, R1, C4; R2, C1; R2, C5; R3, C1; R3, C3; R3, C5; R4, C1; R4, C5; R5, C2; R5, C3; and R5, C4 are closed.

The arrangements of open and closed holes 95 are not limited to those illustrated and other arrangements are within the scope of the disclosure. The arrangement of holes 95 is not limited to five rows and five columns, and in some embodiments, there are one row, two rows, three rows, four rows, or more than six rows. In some embodiments, there is one column, two columns, three columns, four columns, or more than five columns. In some embodiments, the arrangement of open and closed holes 95 is varied during developing process to optimize pattern uniformity. Parameters affecting the arrangement of the holes 95 include the flow of developer and the cross-sectional area of the holes. The optimum arrangement of the holes 95 is determined empirically in some embodiments.

Figure 8A:
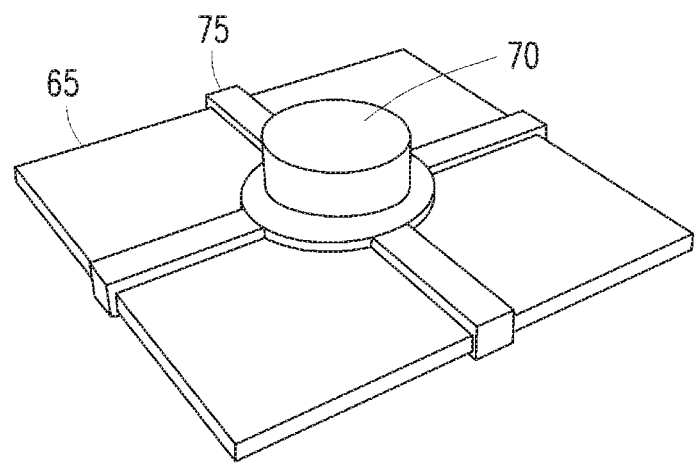
FIG. 8A shows a process stage of a sequential operation according to an embodiment of the disclosure.

FIG. 8A shows the photoresist coated substrate or photomask blank 65 secured by the clamping mechanism 70. In embodiments where the substrate or photomask blank 65 is rectangular-shaped, the clamping mechanism 70 includes four clamping arms 75 extending outward from the central portion of the clamping mechanism in directions at an angle of about 90° from adjacent clamping arms 75. In some embodiments, the clamping arms 75 are extendable, e.g.— they extend and retract, to enable clamping of the substrate or photomask blank 65. In some embodiments, the length of the clamping arms 75 range from about 15 cm to about 19 cm. The clamping arms 75 extend to greater than the length and width of the substrate or photomask blank 65 and then retract to secure the substrate or photomask blank 65 during development. After development, the clamping and the clamping arms 75 extend to release the substrate or photomask blank 65. In other embodiments, different arrangements of the clamping arms 75 are used to clamp substrates having different shapes.

Figure 8B:
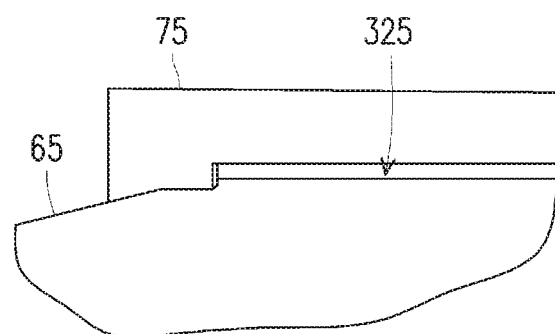
FIGS. 8B, 8C, and 8D are detailed views of the clamping mechanism.
Figure 8C:
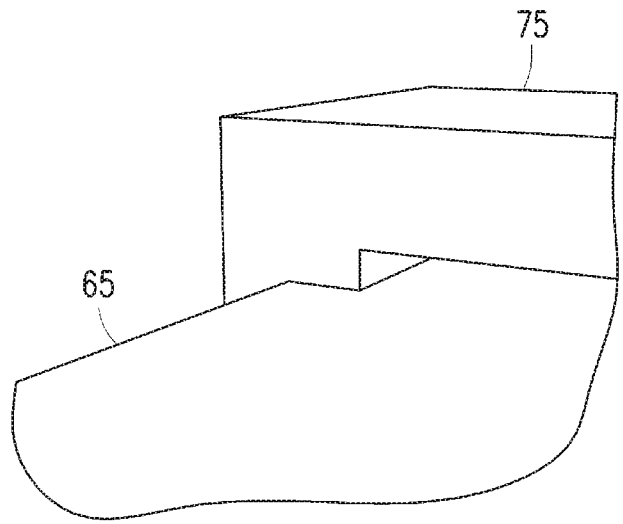
Figure 8D:
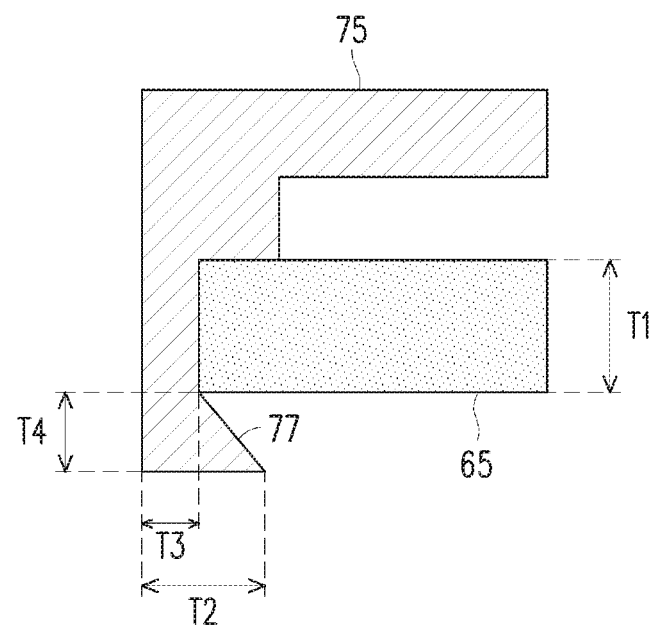

FIGS. 8B, 8C, and 8D are detailed views of the clamping mechanism 70, showing how the clamping arms 75 secure the photoresist coated substrate or photomask blank 65. In some embodiments, an end portion of the clamping arms 75 contacts the photoresist coated substrate of photomask blank 65 at the edge of the photoresist coated substrate or photomask blank 65. FIG. 8C is a further detailed view of FIG. 8B. As shown, there is a gap 325 between the clamping arm 75 across most of the back surface (the main surface not coated with photoresist and opposing the main surface coated with photoresist) of the photoresist coated substrate or photomask blank 65. The gap 325 limits the surface area of the substrate or photomask blank 65 that is contacted by the clamping arms 75, thereby limiting possible damage, such as scratching, to the substrate or photomask blank 65 by the clamping arms 75. At the edge of the photoresist coated substrate or photomask blank 65 the clamping arm 75 contacts the back surface and side surface of the photoresist coated substrate or photomask blank 65 in some embodiments. The clamping arm 75 does not contact the front side (the main surface coated with photoresist opposing the back surface), downward facing, surface of the photoresist coated substrate or photomask blank 65 in some embodiments.

FIG. 8D is a cross-sectional detailed view showing the clamping arm 75 and the front side of the photoresist coated substrate or photomask blank 65 in some embodiments. The lower end of the clamping arm 77 slopes downward in front of the front side of the photoresist coated substrate or photomask blank 65 at an angle of about 45° in some embodiments. The angle is not limited to about 45°, and other angles can be used as long as the substrate or photomask blank is secured. In some embodiments, the substrate or photomask blank 65 has a thickness T1 of about 0.635 cm, although other thicknesses are included within the scope of this disclosure. In some embodiments, the ends of the clamping arms 75 have a length T2 of about 2 cm, the thickness T3 of the clamping arm 75 where the clamping arm contacts the substrate or photomask blank 65 is about 1 cm, and the vertical length T4 that the clamping arm 75 extends past the substrate or photomask blank is about 1 cm, although the present disclosure is not limited to these dimensions.

Figure 9:
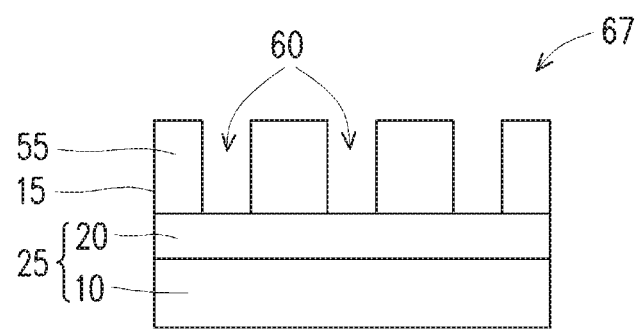
FIG. 9 shows a process stage of a sequential operation according to an embodiment of the disclosure.

In some embodiments, during the development process, the developer 330 dissolves the radiation exposed regions 50 of the positive tone photoresist layer 15 leaving the radiation unexposed regions 55 remaining on the photomask blank 25 thereby forming a pattern 60 in the photoresist layer 15, to provide a patterned photoresist coated substrate or photomask blank 67, as shown in FIG. 9.

In some embodiments, after the development process, the patterned photoresist coated substrate or photomask blank 65 undergoes a rinsing operation to remove any development debris and residual developer. The rinsing operation is performed in the developing tank 80 in some embodiments. After developing, the developing fluid is drained through drain holes 97 and a rinsing fluid, such as deionized water, in some embodiments, is introduced into the developing tank 80. In some embodiments, the rinsing fluid is introduced through the same holes 95 used to introduce developer 330, and the rinsing fluid is subsequently drained through the drain holes 97. In some embodiments, the fluid manifold 90 is configured so that developer and rinsing fluid flow through same holes 95 in the fluid manifold. In some embodiments, the fluid manifold 90 is configured so that developer and rinsing fluid flow through different holes 95 of the fluid manifold 90.

After the rinsing operation, the patterned resist layer is dried. In some embodiments, drying is performed by raising the patterned photoresist coated substrate or photomask blank 65 out of the rinsing or developer fluid and spinning the patterned photoresist coated substrate or photomask blank 67 by rotating the clamping mechanism 70. In some embodiments, the patterned photoresist coated substrate or photomask blank is dried by heating.

Figure 10:
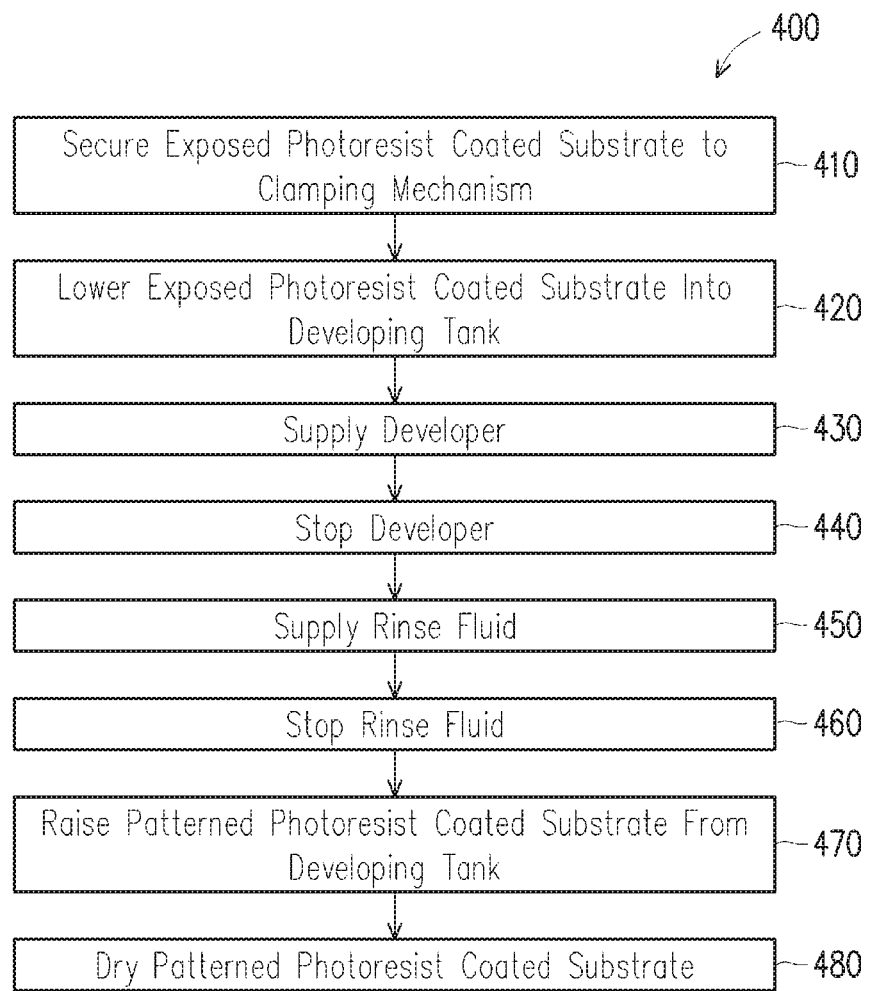
FIG. 10 illustrates a process flow of developing a photoresist pattern on a substrate according to embodiments of the disclosure.

A process flow for a developing process 400 according to some embodiments of the disclosure is shown in FIG. 10. In operation 410, the photoresist coated substrate or photomask blank 65 is secured to the clamping mechanism 70. The photoresist coated substrate 65 is lowered into the developing tank 80 in operation 420. The photoresist coated side of the substrate or photomask blank 65 faces the developing platform 85. Developer 330 is supplied through the holes 95 in the developing platform 85 in operation 430 to develop the photoresist coated substrate or photomask blank 65. After development is complete, the developer flow through the holes 95 is stopped in operation 440 in some embodiments. Rinsing fluid, such as deionized water, is supplied through the holes 95 to remove development debris from the photoresist pattern in operation 450. The rinsing fluid flow is stopped in operation 460 after rinsing is completed. Then, the patterned photoresist coated substrate or photomask blank 67 is raised from the developing tank in operation 470 by raising the clamping mechanism 70. After the patterned photoresist coated substrate or photomask blank 67 is raised, the patterned photoresist is dried in operation 480. The patterned photoresist is dried by spinning the patterned photoresist coated substrate or photomask blank 67 by rotating the clamping mechanism 70 in some embodiments. In some embodiments, heating is used to dry the patterned photoresist coated substrate or photomask blank 67. In some embodiments, infrared heaters are used to dry the patterned photoresist coated substrate or photomask blank 67. In other embodiments, the patterned photoresist coated substrate or photomask blank 67 is dried using heated dry air or inert gas, such as nitrogen or argon.

Figure 11:
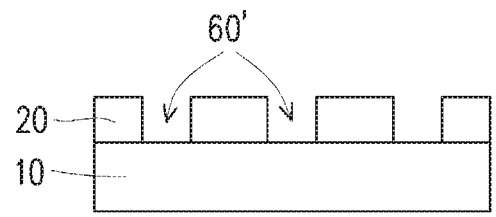
FIG. 11 shows a process stage of a sequential operation according to an embodiment of the disclosure.

Then as shown in FIG. 11, the pattern 60 in the photoresist layer 15 is transferred to the light blocking layer 20 using a suitable dry or wet etching operation and the photoresist layer is removed to form a pattern 60' in the light blocking layer 20, thereby forming a photomask. The light blocking layer 20 has a different etch resistance than the photoresist layer 15. In some embodiments, the etchant is more selective to the substrate light blocking layer 20 than the photoresist layer 15. In some embodiments, any remaining photoresist layer 15 is removed by a suitable stripping or ashing operation.

Figure 12:
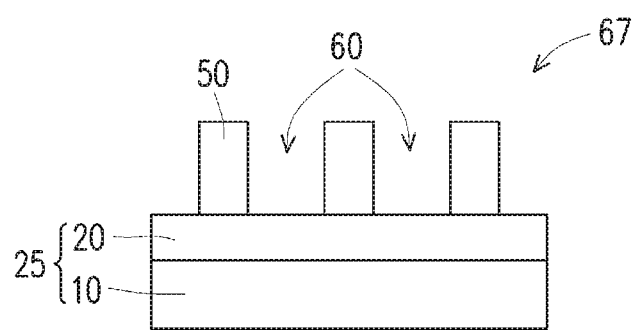
FIG. 12 shows a process stage of a sequential operation according to an embodiment of the disclosure.

In other embodiments, during the development process, the developer 330 dissolves the radiation unexposed regions 55 of the cross-linked negative tone photoresist layer 15, exposing the surface of the substrate light blocking layer 20, and leaving the radiation exposed regions 50 remaining on the photomask blank, thereby forming a pattern 60 in the photoresist layer 15, as shown in FIG. 12.

Figure 13:
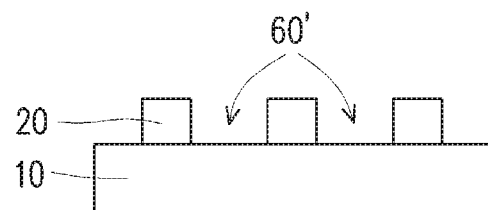
FIG. 13 shows a process stage of a sequential operation according to an embodiment of the disclosure.

Then as shown in FIG. 13, the pattern 60 in the photoresist layer 15 is transferred to the light blocking layer 20 using suitable wet or dry etching operation and the photoresist layer is removed to form a pattern 60' in the light blocking layer 20, thereby forming a photomask. The light blocking layer 20 has a different etch resistance than the photoresist layer 15. In some embodiments, the etchant is more selective to the substrate light blocking layer 20 than the photoresist layer 15. In some embodiments, any remaining photoresist layer 15 is removed by a suitable stripping or ashing operation.

The methods and apparatus disclosed herein can be used to manufacture a semiconductor device instead of a photomask. In embodiments where a semiconductor device is formed, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In embodiments where a semiconductor device is formed on a substrate the layer to be patterned 20 is a metallization layer in some embodiments. The layer to be patterned 20 is formed of a conductive material using metallization processes, and metal deposition techniques, including chemical vapor deposition, atomic layer deposition, and physical vapor deposition (sputtering). In some embodiments, the layer to be patterned 20 is a dielectric layer. When the layer to be patterned 20 is a dielectric layer, the layer to be patterned 20 is formed by dielectric layer formation techniques, including thermal oxidation, chemical vapor deposition, atomic layer deposition, and physical vapor deposition.

The novel developing apparatus and developing techniques according to the present disclosure provide more uniformity and reduced defects in photomasks. By developing the photoresist with the photoresist layer facing downward in the developing tank, defects caused by particles falling onto the photomask are prevented. Further, the amount of photoresist residue is reduced in developing operations according to the present disclosure. In some embodiments of the present disclosure, improved radial uniformity of the photomask features is obtained. In other embodiments of the disclosure, improved uniformity of photomask features by directionless developing is obtained. Thus, the present disclosure allows the formation of sharp, straight-walled photomask features.

An embodiment of the present disclosure is an apparatus including a developing tank and a fluid manifold in the bottom of the developing tank. The fluid manifold includes a plurality of holes through which developer flows and a plurality of valves corresponding to the plurality of holes. The valves allow developer to flow through the holes when open and prevent developer from flowing through the holes when closed. A trench surrounds the fluid manifold through which developer is drained from the developing tank. A controller is configured to control opening and closing of the valves. In an embodiment, the apparatus includes a clamping mechanism configured to insert the substrate into and remove the substrate from the developing tank. In an embodiment, the clamping mechanism includes two pairs of opposing arms. In an embodiment, the apparatus includes a rotation mechanism configured to rotate the clamping mechanism, and the controller is further configured to control the rotation mechanism. In an embodiment, the apparatus includes a motor configured to raise and lower the substrate, and the controller is further configured to control the motor. In an embodiment, a megasonic wave transducer is configured to apply vibration to the developer. In an embodiment, the apparatus includes a developer inlet through which developer flows to the holes of the fluid manifold and a rinsing fluid inlet through which rinsing fluid flows to the holes of the fluid manifold. In an embodiment, the developer inlet and the rinsing fluid inlet are connected. In an embodiment, the developer inlet and rinsing fluid inlet are connected to different holes of the plurality of holes. In an embodiment, the controller and each valve of the plurality of valves are configured so that each valve is individually controlled by the controller.

Another embodiment of the disclosure is an apparatus including a developing tank having a sidewall and a bottom. The bottom has a plurality of holes formed in an internal surface of the bottom. The apparatus includes a plurality of valves, wherein each of the plurality of valves is configured to open and close one of the plurality of holes. A plurality of fluid inlets is connected to each of the plurality of holes. A controller configured to individually control each of the plurality of valves, thereby allowing a fluid to flow through the hole when the hole is open, and block fluid flow when the hole is closed. In an embodiment, the apparatus includes a substrate clamping mechanism and a clamping mechanism lowering and raising motor. In an embodiment, the apparatus includes a rotation mechanism for rotating the clamping mechanism. In an embodiment, the apparatus includes a megasonic wave transducer connected to the developing tank.

Another embodiment of the disclosure is a method including inserting a patternwise exposed photoresist coated substrate into a developer in a developing tank. The photoresist is coated on a first main surface of the substrate. The developing tank has a plurality of holes in a bottom interior surface of the tank through which developer flows. The photoresist coated first main surface of the substrate faces the plurality of holes during development. The photoresist is developed to form a pattern in the photoresist. In an embodiment, the method includes individually opening or closing each of the plurality of holes. In an embodiment, the method includes optimizing a sequence of opening and closing the plurality of holes during the developing. In an embodiment, the method includes securing the patternwise exposed photoresist coated substrate with a clamping mechanism before inserting the patternwise exposed photoresist coated substrate into the developer. In an embodiment, the clamping mechanism contacts the substrate on a second main surface opposing the first main surface during the developing. In an embodiment, the method includes vibrating the developer by applying megasonic waves to the developer during the development.

Another embodiment of the present disclosure is an apparatus, including a developing tank having a sidewall and a bottom. A fluid manifold is adjacent the bottom of the developing tank. The fluid manifold includes a plurality of holes through which developer and rinsing fluid flows, and a plurality of valves corresponding to the plurality of holes. The apparatus further includes a developer inlet through which developer flows to the fluid manifold and a rinsing fluid inlet through which rinsing fluid flows to the fluid manifold. A controller is configured to individually control opening and closing of each of plurality of valves. In an embodiment, a clamping mechanism is configured to lower the substrate into and raise the substrate from the developing tank. In an embodiment, the clamping mechanism is configured to rotate the substrate. In an embodiment, the controller is configured to control raising and lowering of the substrate and rotation of the substrate. In an embodiment, the apparatus includes a megasonic wave transducer configured to apply vibration to the developer. In an embodiment, the holes are arranged in a column and row arrangement in the fluid manifold.

Another embodiment of the present disclosure is a method for manufacturing a photomask, including forming a photoresist layer on a first main surface of a photomask blank, wherein the photomask blank comprises a light blocking layer disposed on a main surface of a transparent substrate. The photoresist layer is selectively exposed to actinic radiation. The photomask blank with the selectively exposed photoresist layer is inserted into a developing tank containing developer so that the first main surface of the photomask blank faces a bottom surface of the developing tank. In an embodiment, the photomask blank with the selectively exposed photoresist layer is secured with a clamping mechanism, wherein the clamping mechanism contacts the photomask blank at a main substrate surface opposing the surface on which the reflective layer is formed or on a lateral side surface of the photomask blank. In an embodiment, the bottom surface of the developing tank includes a plurality of holes through which developer flows during development. In an embodiment, the plurality of holes are arranged in a column and row arrangement. In an embodiment, each of the plurality of holes is individually opened or closed during development. In an embodiment, the developer is vibrated during the development. In an embodiment, the developer is vibrated by applying megasonic waves to the developer. In an embodiment, the photomask blank is rotated during development. In an embodiment, the actinic radiation is an electron beam. In an embodiment, the developer is a tetramethylammonium hydroxide solution and the photoresist is a positive resist.

Another embodiment of the present disclosure is a method of developing a photoresist pattern on a substrate. The method includes securing an exposed photoresist coated substrate into a clamping mechanism of a developing apparatus. The exposed photoresist coated substrate is lowered into a developing tank, wherein the exposed photoresist faces a bottom of the developing tank. Developer is supplied to the developing tank through one or more holes in the bottom of the developing tank to develop the exposed photoresist and form a patterned photoresist coated substrate. After developing the photoresist, flow of the developer to the developing tank is stopped. Rinsing fluid is supplied to the developing tank through the one or more holes in the bottom of the developing tank to rinse the patterned photoresist coated substrate. After rinsing the patterned photoresist coated substrate, flow of the rinsing fluid to the developing tank is stopped. The patterned photoresist coated substrate is raised and the patterned photoresist coated substrate is dried. In an embodiment, the developer and the rinsing fluid flow through valves and the opening and closing of the valves are controlled by a controller. In an embodiment, the drying the patterned photoresist coated substrate includes spin drying. In an embodiment, the lowering the exposed photoresist coated substrate, raising the patterned photoresist coated substrate, supplying developer, supplying rinsing fluid, and drying the patterned photoresist coated substrate are controlled by a controller.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
   a developing tank having a sidewall and a bottom;
   a fluid manifold adjacent the bottom of the developing tank,
   wherein the fluid manifold comprises:
   a plurality of holes through which developer and rinsing fluid flow; and
   a plurality of valves, wherein each of the plurality of the valves corresponds to a different hole of the plurality of holes, and the plurality of valves allow the developer and the rinsing fluid to flow through the holes when open and prevent the developer and the flowing liquid from flowing through the holes when closed;
   a developer inlet through which the developer flows to the fluid manifold;
   a rinsing fluid inlet through which the rinsing fluid flows to the fluid manifold; and
   a controller configured to individually control opening and closing of each of the plurality of valves.

2. The apparatus of claim 1, further comprising a megasonic wave transducer connected to the developing tank.

3. The apparatus of claim 1, further comprising a substrate clamping mechanism and a clamping mechanism lowering and raising motor.

4. The apparatus of claim 3, wherein the controller is further configured to control the clamping mechanism.

5. The apparatus of claim 1, wherein the developer inlet and the rinsing inlet are connected.

6. The apparatus of claim 1, wherein the developer inlet and the rinsing inlet are connected to different holes of the plurality of holes.

7. A method for manufacturing a photomask, comprising:
   forming a photoresist layer on a first main surface of a photomask blank,
   wherein the photomask blank comprises a light blocking layer disposed on a main surface of a transparent substrate;
   selectively exposing the photoresist layer to actinic radiation;
   inserting the photomask blank with the selectively exposed photoresist layer into a developing tank,
   wherein the developing tank has a plurality of holes in a bottom interior surface of the tank through which developer flows, and wherein the first main surface of the photomask blank faces a bottom surface of the developing tank; and
   developing the photomask blank with the selectively exposed photoresist layer to form a pattern in the photoresist, wherein the developing includes individually opening or closing each of the plurality of holes, and each hole is opened or closed by a different valve corresponding to each hole.

8. The method of claim 7, further comprising optimizing a sequence of opening and closing the plurality of holes during the developing.

9. The method of claim 7, further comprising vibrating the developer by applying megasonic waves to the developer during the development.

10. The method of claim 7, further comprising securing the photomask blank with the selectively exposed photoresist layer with a clamping mechanism before inserting the photomask blank with the selectively exposed photoresist layer into the developing tank.

11. The method of claim 10, wherein the clamping mechanism contacts the transparent substrate on a second main surface opposing the first main surface during the developing.

12. The method of claim 7, wherein the developer and the rinsing fluid flow in different holes.

13. The method of claim 7, wherein the photomask blank is rotated at a speed between 50 rpm and 2000 rpm during the developing.

14. A method of developing a photoresist pattern on a substrate, comprising:
   securing a radiation exposed photoresist coated substrate into a clamping mechanism of a developing apparatus;
   lowering the radiation exposed photoresist coated substrate into a developing tank, wherein the developing tank has a plurality of holes in a bottom interior surface of the tank through which developer flows, and a photoresist coated side of the substrate faces a bottom of the developing tank;
   supplying the developer to the developing tank through one or more of the plurality of holes in the bottom of the developing tank;
   developing the photoresist coated substrate to form a patterned photoresist coated substrate, wherein the developing includes individually opening or closing one or more of the plurality of holes, and each of the one or more of the plurality of holes is opened or closed by a different valve corresponding to each hole;
   supplying rinsing fluid to the developing tank through the one or more of the plurality of holes in the bottom of the developing tank to rinse the patterned photoresist coated substrate; and
   raising the patterned photoresist coated substrate.

15. The method of claim 14, wherein the photoresist coated substrate is rotated at a speed between 50 rpm and 2000 rpm during the developing.

16. The method of claim 14, further comprising optimizing a sequence of opening and closing the plurality of holes during the developing.

17. The method of claim 14, further comprising vibrating the developer by applying megasonic waves to the developer during the development.

18. The method of claim 14, wherein the developer and the rinsing fluid flow in different holes.

19. The method of claim 14, wherein an area of the bottom of the developing tank is equal to or greater than an area of the photoresist coated substrate being developed.

20. The method of claim 14, further comprising drying the patterned photoresist coated substrate after the rinsing.

\* \* \* \* \*